(12) United States Patent
Kim et al.

(10) Patent No.: US 7,393,702 B2
(45) Date of Patent: Jul. 1, 2008

(54) CHARACTERIZING THE INTEGRITY OF INTERCONNECTS

(75) Inventors: Choong-Un Kim, Arlington, TX (US); Nancy L. Michael, Arlington, TX (US); Jae-Yong Park, Plano, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 260 days.

(21) Appl. No.: 11/163,493

(22) Filed: Oct. 20, 2005

(65) Prior Publication Data

US 2006/0084189 A1    Apr. 20, 2006

Related U.S. Application Data

(60) Provisional application No. 60/620,479, filed on Oct. 20, 2004.

(51) Int. Cl.
 *H01L 21/00* (2006.01)
(52) U.S. Cl. .................. 438/14; 324/94; 324/519; 257/E21.521

(58) Field of Classification Search .................. 438/17, 438/14; 324/94, 425, 444, 519, 522
See application file for complete search history.

(56) References Cited

U.S. PATENT DOCUMENTS

| 6,368,887 B1 * | 4/2002 | Lowrey et al. ................. 438/17 |
| 6,900,652 B2 * | 5/2005 | Mazur ......................... 324/761 |
| 7,001,785 B1 * | 2/2006 | Chen ............................ 438/10 |

* cited by examiner

*Primary Examiner*—W. David Coleman
(74) *Attorney, Agent, or Firm*—Gardere Wynne Sewell LLP

(57) ABSTRACT

The present invention provides for a system and method of characterizing the integrity of a barrier structure. The barrier structure is an interconnect comprising a porous dielectric layer sandwiched between at least one barrier layer and at least one conducting layer. The method of characterizing the integrity of such an interconnect includes providing an interconnect, infiltrating the interconnect with a solution comprising electrolytes, applying an external bias to the infiltrated interconnect, and characterizing the integrity of the interconnect after application of the external bias.

21 Claims, 4 Drawing Sheets

CHARACTERIZING THE INTEGRITY OF INTERCONNECTS

BACKGROUND OF THE INVENTION

The present invention relates to the field of electrochemistry, and more specifically to the characterizing the integrity of diffusion barriers, particularly diffusion barriers in electronic interconnects.

Current electronics typically incorporate multiple layers of complex interconnect arrays that carry signals to and from its various components. State of the art electronics are comprised of layers of thin film processed metal interconnects (often copper) acting as conductors as well as dielectric materials that are electrically isolated from the conductors. In order to prevent diffusion and chemical reactions between the conducting material and the dielectric material, a thin layers of metal (typically refractory metal or similar material) is typically placed between the conducting and dielectric materials acting a diffusion barrier.

As smaller and higher performance interconnects become increasingly important, the reliability of the diffusion barrier has become critical. Barrier reliability is especially crucial for future technologies as the thickness of these diffusion barriers approach nanoscale dimensions and the barriers are integrated with dielectric materials (e.g., porous low-dielectric [low-κ] materials) that will impose more aggressive mechanical and chemical loads. With such very thin diffusion barriers, even small defects are capable of compromising the integrity of the barrier and instigating various types of functional and physical failures of the copper or dielectric material within the interconnect structure. In addition, relatively thick barriers (e.g., a 25 nm-thick Ta diffusion barrier that was sputter-deposited on MSSQ based porous low-κ dielectric) are capable of failing or, at a minimum, allowing the out-migration and flooding of copper to the dielectric area (e.g., low-κ area) nearby, leaving extensive voids behind.

Such defects and/or failures of diffusion barriers are instigated by at least two parameters, including ambient and defects in the barrier. Out-migration of Cu, for example, is generally found to be driven by an oxidation potential provided by ambient or a stress gradient. Failure in barrier integrity is generally triggered by one or more defects in the barrier. The defect may be present when the barrier was deposited or may develop during subsequent processing/fabrication of the interconnect. To protect from such failure, strategies for eliminating the driving forces for Cu out-diffusion such as ambient infiltration and ways to improve barrier quality are in order. Unfortunately, these are technically challenging, because near perfect barrier coverage must be achieved where there is a less thick structure and where physical support for the barrier layer is lacking. More challenging too is how to characterize harmful and/or fatal defects in these barriers.

Several methods have been used to characterize the reliability and integrity of a barrier layer. These include a direct observation of the barrier microstructure using microscopy, measurement of dielectric break-down, biased thermal stressing (BTS), stress migration (SM) testing, and electromigration (EM) testing. Unfortunately, the above methods were developed for interconnects with dense dielectric and thick barrier layers. As such, they are ineffective for detecting harmful and/or fatal defects in current interconnects, especially those comprising sub-microscopic (e.g., nanoscale) diffusion barriers. Further, the above methods are time consuming and not specifically designed to examine barrier quality which increases their potential for false diagnosis.

The danger of false diagnosis increases when a metallic diffusion barrier is coupled with a pore-seal layer. The pore-seal layer is typically placed to increase structural and/or chemical stability of the barrier. A pore seal is typically comprised of a thin layer of dense dielectric material deposited prior to deposition of the metallic barrier layer. Ideally, the pore-seal prevents ingress of processing gases and/or liquids into the dielectric layer (e.g., a porous low-κ dielectric) and also provides mechanical support for the barrier and for the interconnect. Failure of the pore-seal—either completely or partially—exposes the barrier portion and thin film processed metal portion of the interconnect to the same types of failure as described above. Further, with a pore-seal that is defective, the defect and/or failure is typically local and less extensive and thus, more difficult to detect. Current methods are unable to detect defects and/or failure of a pore seal without extensive and time-consuming examination generally involving several steps and/or equipment.

Therefore, there remains a need to develop a method for evaluating diffusion barrier integrity and for detecting defects in a diffusion barrier and a pore-seal.

SUMMARY OF THE INVENTION

The present invention solves the current problem associated with the inability to characterize the integrity of a diffusion barrier that may or may not include a pore-seal. By providing a simple, effective and highly accurate method for detecting defects in diffusion barriers, the present invention is capable of being used with thick and thin diffusion barriers, including barriers integrated with porous low-dielectric constant (low-κ) materials.

In general, the present invention provides for a system and a method of forming an electrochemical cell, comprising an electrolyte and an interconnect, under an externally applied bias. The interconnect comprising at least one diffusion barrier, dielectric material and conducting material. The diffusion barrier may be a refractory metal or other metallic compound. Unlike conventional methods, the resulting behavior of the present invention provides a means for quantitative and exclusive characterization of barrier integrity and quality.

Generally, and in one form, the present invention provides a system and method of characterizing the integrity of a barrier structure, the barrier structure comprising at least one diffusion barrier integrated with at least one dielectric layer. The diffusion barrier may, in one embodiment, surround a dielectric layer, the dielectric layer being a porous low-κ structure or other such porous structure. The diffusion barrier may also be coupled with a pore-seal. A conducting layer (or pair of electrodes) then surrounds the barrier structure. The integrity of the barrier structure is characterized by voltammetry. When a defect is detected by the present invention, the method may further quantify defect density, as it is sensitive only to defects in the barrier structure.

In another form, the present invention provides for a system and method of characterizing the integrity of any interconnect, the interconnect comprising a barrier structure and a pair of conducting layers. Typically, the interconnect is a dielectric layer sandwiched between at least one barrier layer and at least one conducting layer. The formation of an electrochemical cell between the conducting layers (e.g., refractory metal or other metal) on either side of the barrier structure (diffusion barrier integrated with a dielectric layer) is induced following introduction of an electrolyte on or about the diffusion barrier layer via infiltration. The integrity of the diffusion barrier, such as the existence of a defect and the density of defect(s) in the diffusion barrier layer, is then detected by monitoring the reduction-oxidation (redox) potential and current of the conducting layers under applied bias as characterized by voltammetry. In one embodiment, the barrier structure comprises a porous dielectric layer that may or may not be a low-κ dielectric. In yet another embodiment, the barrier structure is coupled with a pore seal. In embodiments without a pore-seal, when a diffusion barrier layer is defective, the electrolyte is connected to the conducting layer through the defect and peaks associated with a redox reaction appear in a current-voltage voltammogram. When a pore-seal is absent and the diffusion barrier is defect-free, the electrolyte is in contact with the diffusion barrier. Absent from a corresponding current-voltage voltammogram are the characteristic peaks associated with the redox reaction. Here, the peaks are typically replaced by hysteresis. In embodiments that include a pore-seal, a defect-free pore-seal is characterized by electrolytes that are completely isolated from the conducting layers and a corresponding current-voltage voltammogram will reveal no peaks associated with a redox reaction and no hysteresis. When a pore-seal is present and both the pore-seal and the diffusion barrier are defective, the conducting layers are exposed to the electrolytes through the defects in the pore-seal and the barrier, thus, a corresponding current-voltage voltammogram will reveal the characteristic peaks associated with the redox reaction.

In another form the present invention provides for characterization of the integrity of an interconnect as measured with a current-capacitance-voltage (ICV) voltammogram. Current is used to detect the presence of an un-reacted component by measuring the peak potential and comparing the result with the known redox potential of the conducting layer. When a defect is present, a CV voltammogram may reveal the mechanism of the reaction.

As described herein, the integrity of a barrier structure and/or interconnect may include identifying the presence or absence of a defect, characterizing the interface condition of the interconnect and/or detecting the presence or absence of impurities located in the pores of a barrier structure that is porous. For example, the condition or profile of a porous diffusion barrier interface may be characterized (e.g., during fabrication or manufacturing) by observing the shape of the corresponding current-voltage voltammogram hysteresis. This is because the shape of hysteresis is affected by the contact area between the electrolyte and the surface (interface) between the diffusion barrier and the dielectric layer as well as the roughness of the interface.

Impurities that are trapped in pores of a barrier structure and/or interconnect comprising a dielectric layer with an open pore structure are also detected by methods of the present invention. When impurities are located in the pores, electrolytes will typically react with the impurities and produce reaction peaks that may be detected by the present invention (i.e., as measured using a current-voltage voltammogram) when the electrochemical cell is set at a different bias. As such, the presence, type and amount of impurities are characterized by the present invention.

Other features of the present invention, include its ease of use and cost-effectiveness—it is implemented without any particular investment because it works with a standard test structure and common instruments—and its ability to be used for detection of other types of defects and/or failures, such as those in a pore seal.

Those skilled in the art will further appreciate the above-noted features and advantages of the invention together with other important aspects thereof upon reading the detailed description that follows in conjunction with the drawings.

BRIEF DESCRIPTION OF THE DRAWINGS

For more complete understanding of the features and advantages of the present invention, reference is now made to the detailed description of the invention along with the accompanying figures, wherein.

DETAILED DESCRIPTION OF THE INVENTION

Figure 1:
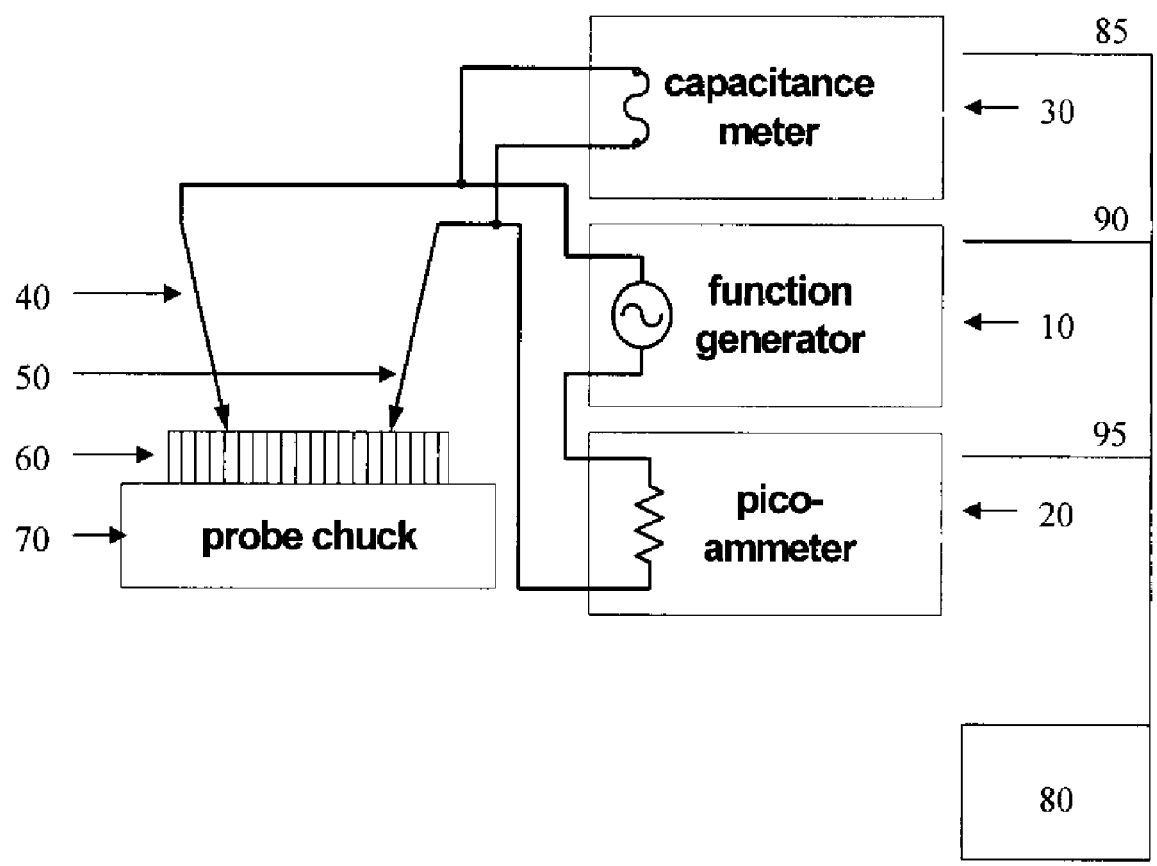
FIG. 1 depicts a schematic representation of a measurement apparatus in accordance with one aspect of the present invention.

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

As used herein, characterizing the integrity of an interconnect requires that the interconnect have a barrier structure with a diffusion barrier integrated with a dielectric layer (typically having an open pore structure), the interconnect comprising at least one diffusion barrier, at least one dielectric layer, and at least one conducting layer. In one aspect, the conducting layer may form part of the interconnect.

Operation of the present invention is based on the fact that a liquid solution comprising electrolytes, can infiltrate a barrier structure by infiltrating the porous portion of the dielectric layer having an open pore structure. The integrity of the barrier structure may then be characterized through use of voltammetry. Characterization involves application of a potential to a system of the present invention and measuring a current response (due to a redox reaction) over a range of potentials by a voltage sweep. Species formed by oxidation on the first (forward) scan are reduced on the second (reverse) scan. An estimate of the redox potential, rate of electron transfer and stability of the system of the present invention are then provided.

Applying the above to an example of the present invention, when a barrier structure is a dielectric layer sandwiched between diffusion barrier layers and conducting layers (at least one barrier layer and conducting layer on each side), the integrity of the barrier structure may be measured and quantified after immersion of the barrier structure in a solution containing electrolytes.

In one embodiment, the conducting layer may be Cu. When an electrolyte infiltrates the Cu interconnect structure, it creates a situation substantially the same as an electrochemical cell. The conducting layers act as the electrodes, and are electrically connected through ions in the electrolyte. When external bias is applied to the two electrodes, an electrochemical reaction occurs that is dependent on the type of conducting layer(s) exposed to the electrolyte and the level of the external potential. With a barrier that is defect-free, the electrolyte is in contact entirely with the barrier. When a barrier is defective, the electrolyte is also connected to Cu through the defect. In this case, the redox reaction of Cu occurs at around +/−0.3V as shown in equation (1) below:

$$Cu^\circ \leftrightarrow Cu^{++} + 2e^- \qquad (1)$$

Since the potential of the more refractory metals is much higher than copper, the presence of reaction current at +/−0.3V bias indicates the defective barrier. Furthermore, the current measures the density of the defects because it is proportional to the area of Cu exposure. In practice, the redox potential and current is best characterized by using cyclic bias (e.g., an IV voltammogram). The area of copper exposure through defects in the barrier is also quantified, because the copper redox potential is significantly lower than those of other refractory metals.

FIG. 1 is a schematic representation of a system of the present invention comprising a function generator 10 (e.g., a voltage sweep generator) and a pico-ammeter 20 to measure the current while bias is typically cycled at a constant rate (linear or step increase). A pico-ammeter is operably connected to interconnect 60 via 50. Interconnect 60 is on support 70 (e.g., a probe chuck). Support 70 must be able to receive an electrolyte solution and may also be one that can be perfused with an electrolyte solution. Interconnect 60 is at least one barrier structure sandwiched by at least one conducting layer and capable of being immersed in a solution of electrolytes.

A capacitance meter 30 is typically included in the system's circuit for capacitance measurement (FIG. 1). The capacitance meter is operably connected to interconnect 60 via 40. Optionally, data analyzer/reader 80 is operably connected to the system of FIG. 1 via 85, 90 and/or 95. The data analyzer/reader may house additional software for collecting and/or reviewing data about interconnect 60.

Capacitance measurement is important to determine the level of electrolyte infiltration. With the present invention, capacitance increases as infiltration proceeds because it adds ionic dipoles and short circuits between conducting layers (or electrodes). Capacitance measurement is particularly useful when a pore-seal is placed prior to barrier deposition; when the pore-seal is intact, capacitance is the only parameter to indicate electrolyte infiltration.

Useful examples of the present invention are herein provided. In one embodiment, Example A, a first set of interconnects include a pair of 50 µm thick (width) Cu or Ta electrodes patterned on a printed circuit board (PCB).

In another embodiment, Example B, a second set of interconnects include two Cu interconnects patterned in a low dielectric and porous material, such as methylsilsesquioxane (MSSQ, k~2.2). All samples in Example B were processed at International SEMATECH (ISMT) using procedures known to one of ordinary skill in the art. The samples were fabricated with different diffusion barrier arrangements: 25 nm Ta or 50 nm silicon carbonitride (SiCN)/0.5 nm Ta. For the SiCN/Ta sample, SiCN was deposited by plasma-enhanced chemical vapor deposition (PECVD) and was a pore seal, creating a non-porous lining prior to Ta deposition. After metallization, a passivation stack of 100 nm silicon nitride (SiN)/200 nm silicon dioxide (SiO$_2$) was deposited, followed by tantalum nitride (TaN) and aluminum (Al) layers over the bond pad openings. There is no limit to the pattern that may be used in such a wafer or that may be characterized by the present invention. For Example B, a standard comb test structure (as provided by ISMT) was selected for the voltammogram. Typically, larger interface area provide for reaction currents that are readily detectable without interference (e.g., background noise); however, any interface area is suitable to use with the present invention.

For the electrolyte solution, any electrolyte solution useful in performing cyclic voltammetry is suitable. This includes acidic or basic solutions or those mixed with solvents to assist in infiltration. With the present invention, samples were measured in a water-based solution containing at least about 0.1 to 0.5% hydrochloric acid (HCl). In Example A, a voltammogram was conducted by directly immersing the pattern into an electrolyte solution. For Example B, the electrolyte solution was infiltrated through the side of the chip. Typically, the time for the electrolyte to reach the comb structure was at least about 2 minutes to 5 minutes.

Figure 2:
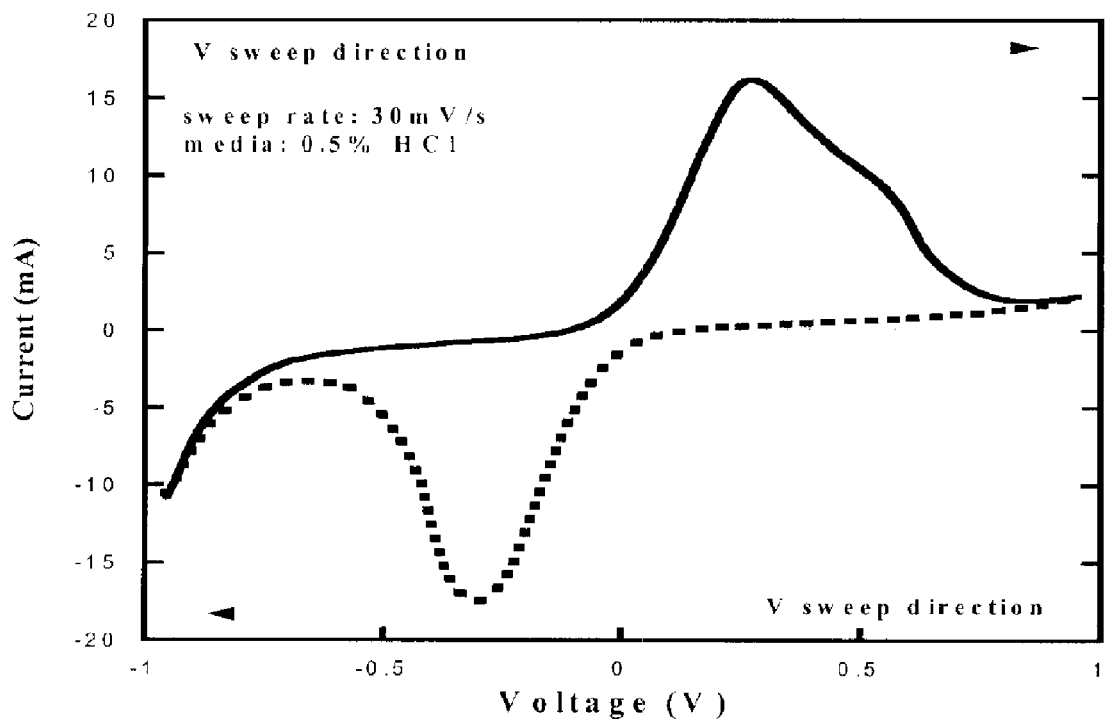
FIG. 2 depicts an current-voltage (IV) voltammogram taken from a barrier structure comprising two Cu lines immersed in an electrolyte solution comprising 0.5% HCl.
Figure 3:
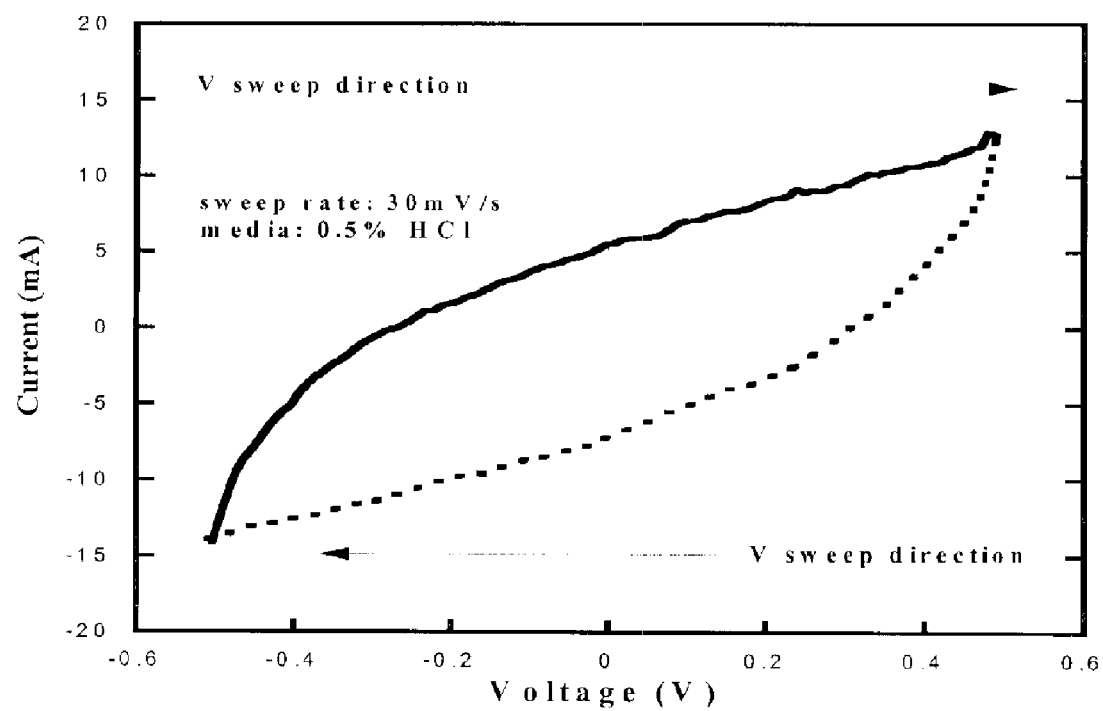
FIG. 3 depicts an IV voltammogram taken from a barrier structure comprising two tantalum (Ta) lines immersed in 0.5% HCl.

FIG. 2 shows results of a cyclic voltammogram conducted on a structure of FIG. 1 with two parallel 50 µm thick Cu electrode on PCB of Example A. FIG. 3 shows results of a voltammogram conducted on a structure of FIG. 1 with two parallel 50 µm thick Ta lines on PCB of Example A. The electrolyte solution used for FIG. 2 and FIG. 3 was a 0.5% HCl solution and the capacitance measurement was done with +/−10 mV signal wave with 1 MHz frequency. Typical voltage sweep was +/−0.5 or +/−1V with a rate of 30 mV/s. IV voltammograms from Cu (FIG. 2) and Ta (FIG. 3) are distinctively different. With a pair of Cu electrodes, peak current occurred at a potential at or near +/−0.3, while a peak current was absent when a pair of Ta electrodes were used. In FIG. 3, the voltammogram exhibits a simple hysteresis.

The different voltammogram results for Cu and Ta electrodes are expected, because when an external bias is applied in any electrochemical cell, two types of currents are produced—an ionic current and a reaction current. The voltammogram resulting from Ta electrodes is due to the behavior of refractory Ta electrodes in an ionic current. An ionic current is the result of ion drift in electrolyte under electric potential. With an electrolyte solution of HCl, hydrogen ions (H$_+$) drift from anode to cathode while chloride ions (Cl$^-$) drifts from cathode to anode. Without a sink and/or source for ions in such an electrolyte solution, the ionic current decreases as ions accumulate at each electrode because the concentration gradient acts against the external bias. When the bias direction is reversed, the electric bias and the concentration gradient work together, resulting in initially high but steadily decreasing ionic current as the ion accumulation starts to work against the bias. This explains the simple hysteresis for the IV voltammogram with Ta electrodes, because Ta is electrochemically inert and does not react with the electrolyte in this bias range. The reaction current exists when electrodes are electrochemically active and, thus, act as sink and source for ions by process of a redox reaction. The redox reaction adds or drains the ions to or from, respectively, a solution comprising electrolytes, producing an additional current to the background ionic current. Such is the case for the voltammogram with Cu electrodes, as seen in FIG. 3, where a peak current exists near or at +/−0.3 V. This peak potential is consistent with the known redox potential of Cu (0.34 V at 25 degrees Centigrade).

As such, methods of the present invention as described above provide clear and concise results applicable to any open electrode structure. For measurement of interconnect structures, methods of the present invention are typically conducted after infiltration of an electrolyte solution into or about the interconnect. Because infiltration of an electrolyte solution into or about the interconnect occurs at a relatively fast rate, there is little reason to delay measurements. Nonetheless, infiltration should be complete. This may be monitored by measuring the change in capacitance. For example, the capacitance change of a comb structure is typically monitored continuously.

Figure 4:
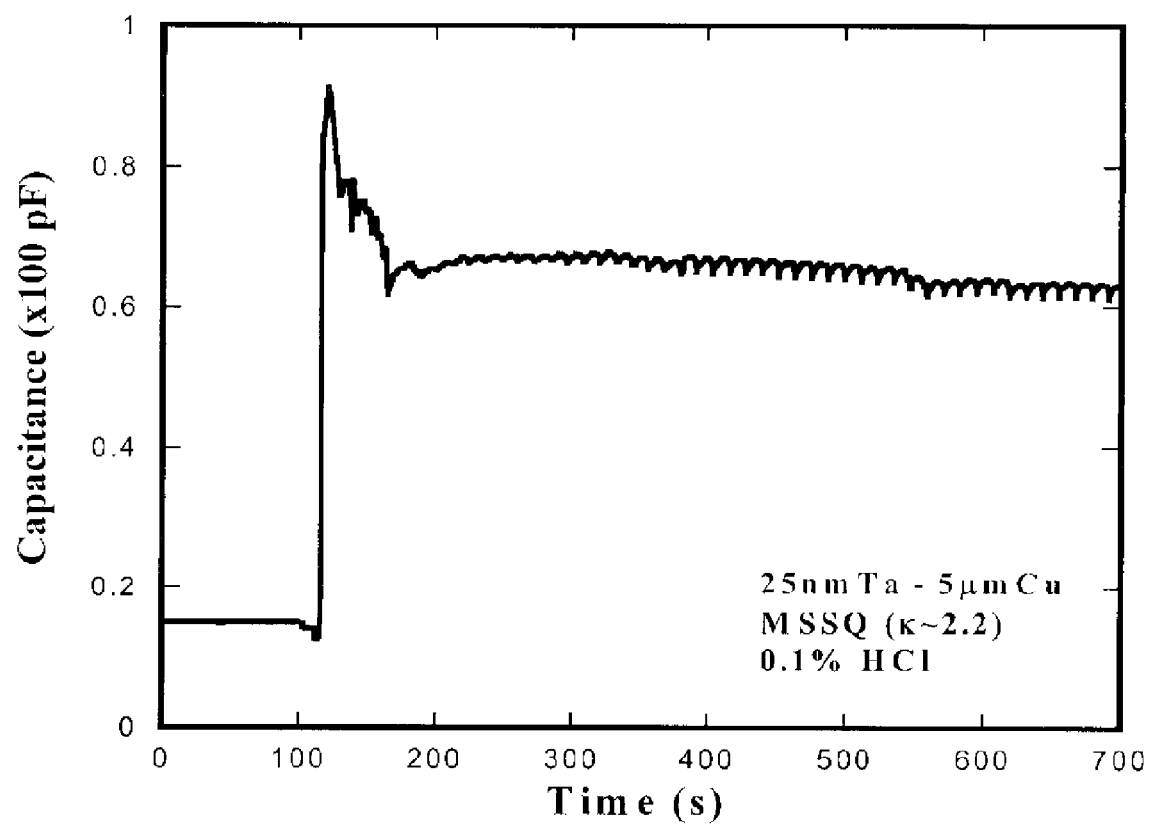
FIG. 4 depicts capacitance change measured during infiltration of 0.1% HCl in an interconnect comprising a standard comb structure with 5 μm-wide Cu.

FIG. 4 illustrates the capacitance change as measured during infiltration of a sample comprising a comb structure. The capacitance measurement was done with +/−1 0 mV signal wave with 1 MHz frequency. The capacitance increase is rapid as the electrolyte infiltrates the comb structure. A steady state value is typically reached within a few minutes, which is about 3 minutes in the structure measured in FIG. 4. With the present invention, the rapid infiltration rates of the electrolytes provide for accurate and reliable voltammograms without parasitic signals. Importantly, the present invention may be used with any electrolyte solution, sweep condition, and/or diffusion barrier. Data has shown that regardless of the diffusion barrier, the present invention is capable of characterizing its integrity.

Figure 5:
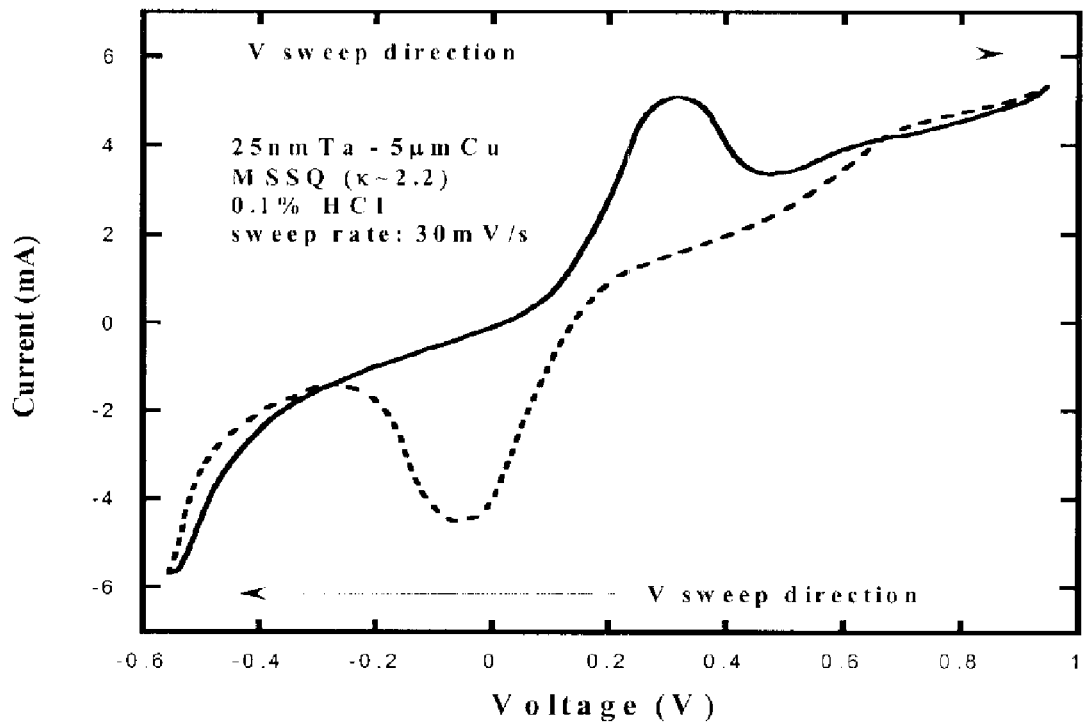
FIG. 5 depicts an I-V voltammogram taken from an interconnect comprising MSSQ as the porous low-κ layer.

FIG. 5 shows a voltammogram measurement of Example B, in which the sample is an ISMT comb test structure comprising 0.5 μm Cu interconnects with 25 nm Ta diffusion barrier in MSSQ porous low-κ dielectric. The capacitance measurement was done with +/−10 mV signal wave with 1 MHz frequency. Here the electrolyte solution was 0.1% HCl. The Cu redox peak was near +/−0.3 V, therefore, the 25 nm Ta barrier was not defect free but had defects, likely to be micropore and/or pinhole defects, that exposed a significant fraction of Cu. When the same barrier sample was evaluated for defects using transmission electron microscope (TEM), no defects were found (data not shown).

The above failure was verified by testing the sample using BTS and baking; however, these verification methods were not rapid or efficient, because they took several days to reveal the barrier failure, and were not as inexpensive as the present invention. In fact, the other methods are not only more time consuming, they were not conclusive on their own and required a second analysis or methodology to confirm the mechanism of failure (e.g., TEM analysis after BTS and baking).

There are many valuable features of the present invention. The present invention provides conclusive evidence of barrier failure of an interconnect within minutes to a few hours. Furthermore, because the peak current is proportional to the area of Cu exposure, the present invention also provides a quantitative measure of the defect density as illustrated in FIG. 5. In addition, peak potential is strictly a function of the chemical redox reaction and remains the same regardless of test conditions, such as defect density, size of electrodes, and absence or presence of a low-κ dielectric. Therefore, the present invention may be used to detect impurity residues in the pores of any porous dielectric material, including new refractory compounds (e.g., TaN and titanium silicon nitride [TiSiN]).

Figure 6:
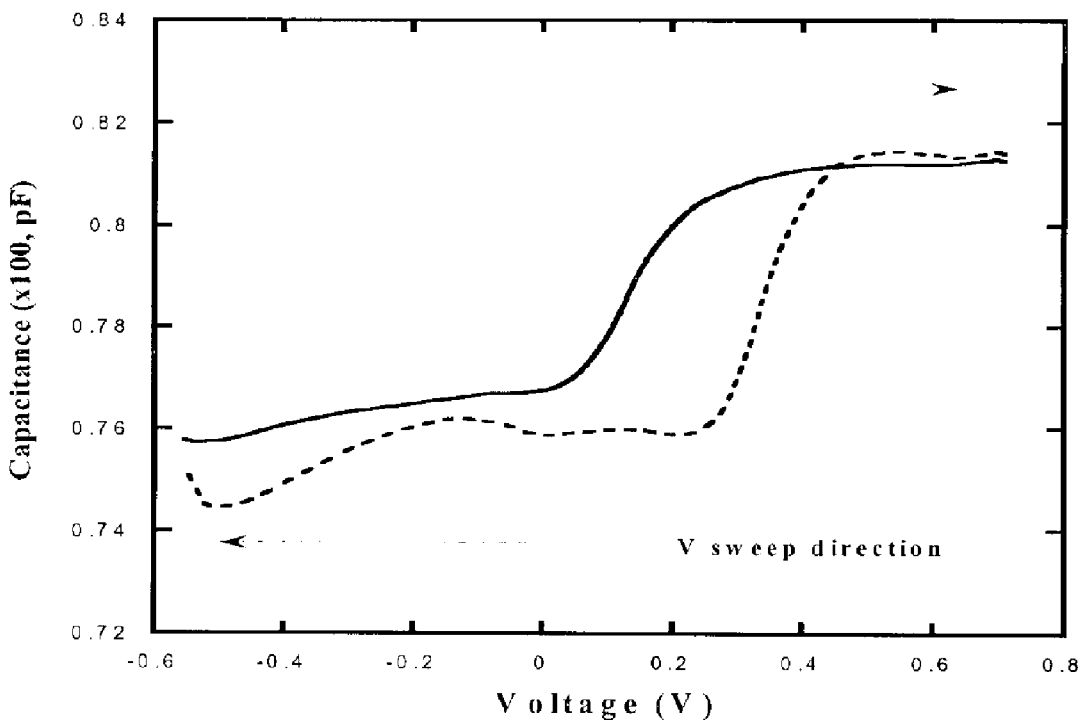
FIG. 6 depicts a capacitance-voltage (C-V) voltammogram measured simultaneously with the I-V voltammogram shown in FIG. 5.

The present invention may be also be used to detect the presence of an un-reacted component by measuring the peak potential and comparing the result with the known redox potential of the conducting layer or open electrode structure. As needed, it is useful to incorporate CV voltammogram measurements to complement the IV measurements of the present invention. FIG. 6 shows a CV voltammogram obtained simultaneously with the IV voltammogram illustrated in FIG. 5. The CV shows a significant hysteresis in the bias range of the redox potential. This is due to the addition and removal of ionic dipoles. As such, the CV voltammogram measurements support the IV voltammogram findings. CV voltammograms are, thus, used to reveal the mechanism of reaction (e.g., whether a peak is a result of the reaction).

In general, the present invention provides for an electrochemical behavior of an electrochemical cell formed by electrolyte and interconnects under cyclic bias. Unlike conventional methods, the resulting voltammogram measurements of the present invention provide a means for quantitative and exclusive characterization of barrier integrity and quality.

Use of the present invention is not limited to characterizing the integrity of a barrier structure. The present invention is also for characterizing the integrity of a pore-seal (data not shown). When a pore-seal is present, the electrolyte solution is not in electrical connection with the electrode. Therefore, an IV voltammogram measurement of the present invention will show only the electronic current (leakage current via low-κ layer) when there is an intact pore-seal. On the other hand, when the pore-seal is not intact, the electrolyte in solution will become electrically connected to the underlying metallic layers and an IV voltammogram measurement of the present invention will show ionic current behavior (e.g., if Ta is exposed using an SiCN/Ta sample). Such a result using a SiCN/Ta sample when Ta was exposed was substantially similar to that shown in FIG. 2. In addition, the extent of the hysteresis was used to measure the density of defects in the pore-seal.

The present invention may be readily modified to suit any particular diffusion barrier or interconnect and optimized for infiltration of the electrolyte solution into the sample. Such modifications and optimizations require no undue experimentation for one of ordinary skill in the art. The present invention works optimally when there is sufficient electrolyte solution infiltrating the diffusion barrier. Less quantitative results arise when the amount of solution is not adequate, because voltammogram measurements will evolve with time. Some ways to keep a sufficient electrolyte solution infiltrating the diffusion barrier include minimizing hydrogen gas formation (resulting from the redox reaction of equation [1]) and/or retaining sufficient solution on the diffusion barrier by placing top-openings near the sample (e.g., comb pattern) during measurement.

With the present invention, the profile of a barrier-conducting layer surface interface may be characterized when the barrier is a porous low-κ barrier by observing the shape of the corresponding current-voltage voltammogram hysteresis. The magnitude and shape of the area within the hysteresis curve may be used to provide a degree of roughness of the barrier layer surface. This is because the area within the hysteresis is a physical representation of the number of ions that have drifted and have contacted the barrier interface at a given voltage sweep rate. As such, the rougher the barrier surface at this interface, the fatter the hysteresis as compared with one obtained from a barrier surface that is smooth. In addition, the shape of hysteresis (as well as the magnitude or the area) depends on the profile of the mating electrode. When the cross section of the interconnects (barrier plus conducting layer or electrode) are of a square profile, the two mating surfaces of the conducting layer, as they are connected by electrolytes in solution, are a constant distance apart. Here, the change in current will be monotonic with increasing and decreasing bias. On the other hand, when the interconnect cross-section is tapered (e.g., narrower at the bottom), the mating surfaces are not equidistant. In this case, non-equal distance between two conducting layer (electrode) surfaces leads to ion accumulation that occurs at different rates over the vertical dimension of the conducting surfaces (electrodes). Here, the change in current is not monotonic with bias. Rather, the current-voltage voltammogram has curvature changes in the hysteresis.

The present invention is also capable of detecting impurities that infiltrate a interconnect or diffusion barrier via its dielectric layer having an open pore structure. This works in the same manner as previously discussed when presenting with two parallel Cu electrode as described for Example A. With the present invention, impurities such as metallic ions or radicals that have attached to the porous surface are then dissolved into the solution comprising electrolytes and subsequently ionized. Upon application of an external bias, the ions undergo a redox reaction, especially by plating to and dissolving from the diffusion barrier surface. Understanding that every ion presents with a specific redox potential, the specific ion in question is determined by applying the appropriate external bias and measuring the peaks (e.g., at a different potential from Cu, Cu being the conducting layer) presented with a current-voltage voltammogram. The particular ion as well as the amount trapped in the pore may be measured in this manner. For example, the redox peak for iron (Fe) is at or near 0.7 V and the redox peak for titanium (Ti) is at or near 0.2 V which can clearly be distinguished from the redox peak of Cu. As such, when a trapped impurity is suspected, the bias range for the voltammogram is adjusted to the redox potential of the suspected impurity.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed is:

1. A method of characterizing the integrity of an interconnect comprising the steps of:
   providing an interconnect portions of which have a pore structure;
   infiltrating the interconnect with a solution comprising electrolytes;
   applying an external bias to the infiltrated interconnect; and
   characterizing the integrity of the interconnect after application of the external bias.

2. The method of claim 1, wherein characterizing the integrity of the interconnect includes a voltammogram selected from the group consisting of current-voltage, current-capacitance, and current-capacitance-voltage.

3. The method of claim 1 wherein the solution is hydrochloric acid.

4. The method of claim 1, wherein the interconnect comprises a porous dielectric layer sandwiched between at least one barrier layer and at least one conducting layer.

5. The method of claim 1, wherein the interconnect includes one of the group consisting of a porous low-dielectric constant material, a pore-seal, and combinations thereof.

6. The method of claim 1, wherein the interconnect is a semiconductor chip.

7. The method of claim 2, wherein the voltammogram provides information about the interconnect selected from the group consisting of a presence or absence of a defect, defect density, failure, interface condition, impurities, and combinations thereof.

8. The method of claim 4, wherein the diffusion barrier is a refractory metal.

9. The method of claim 4, wherein the conducting layer is copper.

10. The method of claim 4, wherein the conducting layer forms part of the interconnect.

11. A system for characterizing the integrity of an interconnect comprising:
   an interconnect immersed in an electrolyte solution, wherein portions of the interconnect have a pore structure;
   a function generator providing a potential and operably connected to the interconnect;
   a capacitance meter for measuring capacitance and operably connected to the interconnect;
   a picoammeter for measuring current and operably connected to the interconnect, thereby characterizing the integrity of the interconnect.

12. The system of claim 11, wherein characterizing the integrity of the interconnect includes a voltammogram selected from the group consisting of current-voltage, current-capacitance, and current-capacitance-voltage.

13. The system of claim 11, wherein the solution is hydrochloric acid.

14. The method of claim 11, wherein the interconnect comprises a porous dielectric layer sandwiched between at least one barrier layer and at least one conducting layer.

15. The system of claim 11, wherein the interconnect includes one of the group consisting of a porous low-dielectric constant material, a pore-seal, and combinations thereof.

16. The system of claim 11, wherein the interconnect is a semiconductor chip.

17. The method of claim 11, further comprising a data reader/analyzer to collect and read data about the integrity of the interconnect.

18. The system of claim 12, wherein the voltammogram provides information about the interconnect selected from the group consisting of a presence or absence of a defect, defect density, failure, interface condition, impurities, and combinations thereof.

19. The method of claim 14, wherein the diffusion barrier is a refractory metal.

20. The method of claim 14, wherein the conducting layer is copper.

21. The method of claim 14, wherein the conducting layer forms part of the interconnect.

* * * * *